United States Patent
Kakinuma et al.

(10) Patent No.: US 11,915,963 B2
(45) Date of Patent: Feb. 27, 2024

(54) PROTECTIVE MEMBER FORMING APPARATUS

(71) Applicant: DISCO CORPORATION, Tokyo (JP)

(72) Inventors: Yoshinori Kakinuma, Tokyo (JP); Yoshikuni Migiyama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 359 days.

(21) Appl. No.: 17/392,491

(22) Filed: Aug. 3, 2021

(65) Prior Publication Data

US 2022/0059390 A1 Feb. 24, 2022

(30) Foreign Application Priority Data

Aug. 21, 2020 (JP) ................................ 2020-140466

(51) Int. Cl.
*H01L 21/683* (2006.01)
*B28D 5/00* (2006.01)

(52) U.S. Cl.
CPC ........ *H01L 21/6836* (2013.01); *B28D 5/0064* (2013.01); *B28D 5/0082* (2013.01)

(58) Field of Classification Search
None
See application file for complete search history.

(56) References Cited

U.S. PATENT DOCUMENTS

| 2008/0184855 | A1* | 8/2008 | Yamamoto | B26F 1/3846 83/100 |
| 2010/0089216 | A1* | 4/2010 | Nonaka | B25J 15/04 83/613 |
| 2014/0134761 | A1* | 5/2014 | Sekiya | H01L 22/12 438/15 |
| 2015/0059986 | A1* | 3/2015 | Komatsu | C03B 33/027 83/872 |

FOREIGN PATENT DOCUMENTS

| JP | 2017050536 A | 3/2017 |
| JP | 2017168565 A | 9/2017 |

* cited by examiner

*Primary Examiner* — Charles Capozzi
(74) *Attorney, Agent, or Firm* — Greer, Burns & Crain, Ltd.

(57) ABSTRACT

A protective member forming apparatus includes an integrating unit that integrates a resin sheet held by a chuck table with a wafer by a resin, a conveying unit that conveys the wafer, and a cutting unit that holds, by a cutting table, the wafer integrated with the resin sheet conveyed by the conveying unit and cuts the resin sheet by a cutting section along the wafer. The cutting unit includes a detection unit that images the wafer by a camera and detects a position of a periphery of the wafer, and a control unit that causes cutting of the resin sheet by the cutting section to be performed only in the case where a peripheral edge of the wafer detected coincides with a track of a cutter blade of the cutting section when the preset resin sheet is cut.

4 Claims, 10 Drawing Sheets

PROTECTIVE MEMBER FORMING APPARATUS

BACKGROUND OF THE INVENTION

Field of the Invention

The present invention relates to a protective member forming apparatus.

Description of the Related Art

In a process of manufacturing semiconductor device chips or various electronic parts, there are steps of thinning a wafer or the like formed with various devices and dividing the wafer or the like into device chips. The wafer is processed in a state of being held by a chuck table. In that instance, for preventing the wafer from being damaged, the front surface of the wafer is protected by being attached to a resin sheet, such as a pressure sensitive adhesive tape, or a substrate.

For example, in a case of a wafer with a ruggedness (projections and recesses) such as metal electrode bumps on the front surface, it is difficult to attach a pressure sensitive adhesive tape in close contact with the ruggedness, and swarf and processing liquid would penetrate into the gaps, possibly leading to exfoliation. Further, since the pressure sensitive adhesive tape cannot absorb the ruggedness sufficiently, the ruggedness would be transferred to the wafer at the time of thinning the wafer by grinding the back surface. In view of this, a processing method of laminating a liquid resin curable by an external stimulus such as ultraviolet (UV) rays in a flat form to provide a protective member has been proposed (see, for example, Japanese Patent No. 6312343 and Japanese Patent Laid-open No. 2017-168565).

In the processing methods disclosed in Japanese Patent No. 6312343 and Japanese Patent Laid-open No. 2017-168565, first, a liquid resin is supplied to a sheet larger than the wafer. Next, a protective sheet is put in close contact with the ruggedness on the front surface of the wafer, after which the liquid resin is pressed and spread on the protective sheet side of the wafer, and the liquid resin is cured by an external stimulus, whereby a wafer with the protective member can be formed, the ruggedness in the wafer being absorbed by the liquid resin.

SUMMARY OF THE INVENTION

After the above-described protective member is formed, in a step of grinding the wafer, the protective member protruding to the outside of the wafer is unnecessary, so that the protective member at the periphery of the wafer needs to be cut along the wafer. However, unlike a case of positioning the wafer alone at a predetermined position, a wafer accompanied by a sheet is difficult to position at a predetermined position with an accuracy of equal to or less than 0.1 mm. Therefore, by only conveying the wafer with the sheet to a stage of cutting, the position of the wafer may be deviated, and the wafer may be damaged by mistake at the time of cutting.

Accordingly, it is an object of the present invention to provide a protective member forming apparatus with which a protective member protruding from a peripheral edge of a wafer can be removed while the wafer is restrained from being damaged.

In accordance with an aspect of the present invention, there is provided a protective member forming apparatus for forming a protective member on one surface of a wafer. The protective member forming apparatus includes an integrating unit that supplies a liquid resin curable by an external stimulus to a sheet larger than the wafer held by a chuck table, spreads the resin on the one surface of the wafer, and cures the resin by an external stimulus, to integrate the sheet with the wafer by the resin, a conveying unit that conveys the wafer integrated with the sheet, and a cutting unit that holds, by a cutting table, the wafer integrated with the sheet conveyed by the conveying unit and cuts the sheet by a cutting section along a periphery of the wafer. The cutting unit includes a detection unit that images the wafer by a camera and detects a position of a peripheral edge of the wafer, and a control unit that causes cutting of the sheet by the cutting section to be performed only in a case where the peripheral edge of the wafer detected coincides with a track of the cutting section when the preset sheet is cut.

Preferably, the cutting unit includes a main body section smaller in diameter than the wafer, and a sheet holding section that holds the sheet with a spacing from a peripheral edge of the main body section, and the cutting section has a cutter blade that cuts into the sheet from a side of the cutting table between the main body section and the sheet holding section.

The present invention produces an effect that the protective member protruding from the peripheral edge of the wafer can be removed while the wafer is restrained from being damaged.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
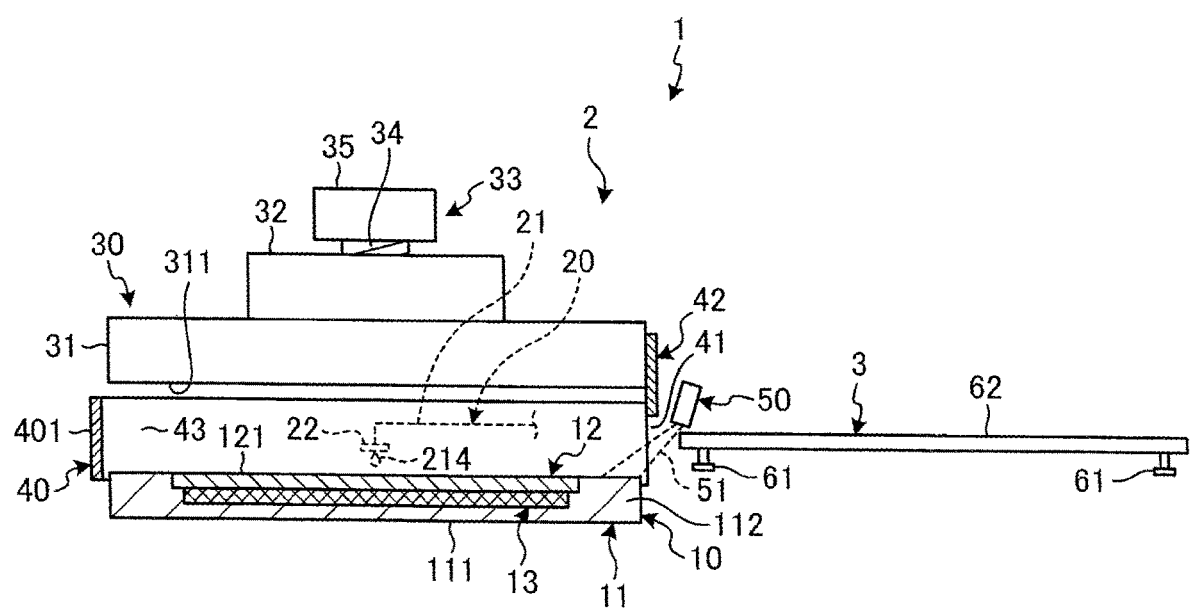
FIG. 1 is a side view schematically depicting, partly in section, a configuration example of an integrating unit and a conveying unit of a protective member forming apparatus according to an embodiment.

An embodiment of the present invention will be described in detail below referring to the drawings. The present invention is not to be limited by the contents of description in the following embodiment. In addition, the configuration elements described below include those which can be easily conceived by a person skilled in the art and those which are substantially the same. Further, the following configurations can be combined, as required. Besides, various kinds of omission, replacement, or modification of the configuration are possible within such ranges as not to depart from the gist of the present invention.

Figure 2:
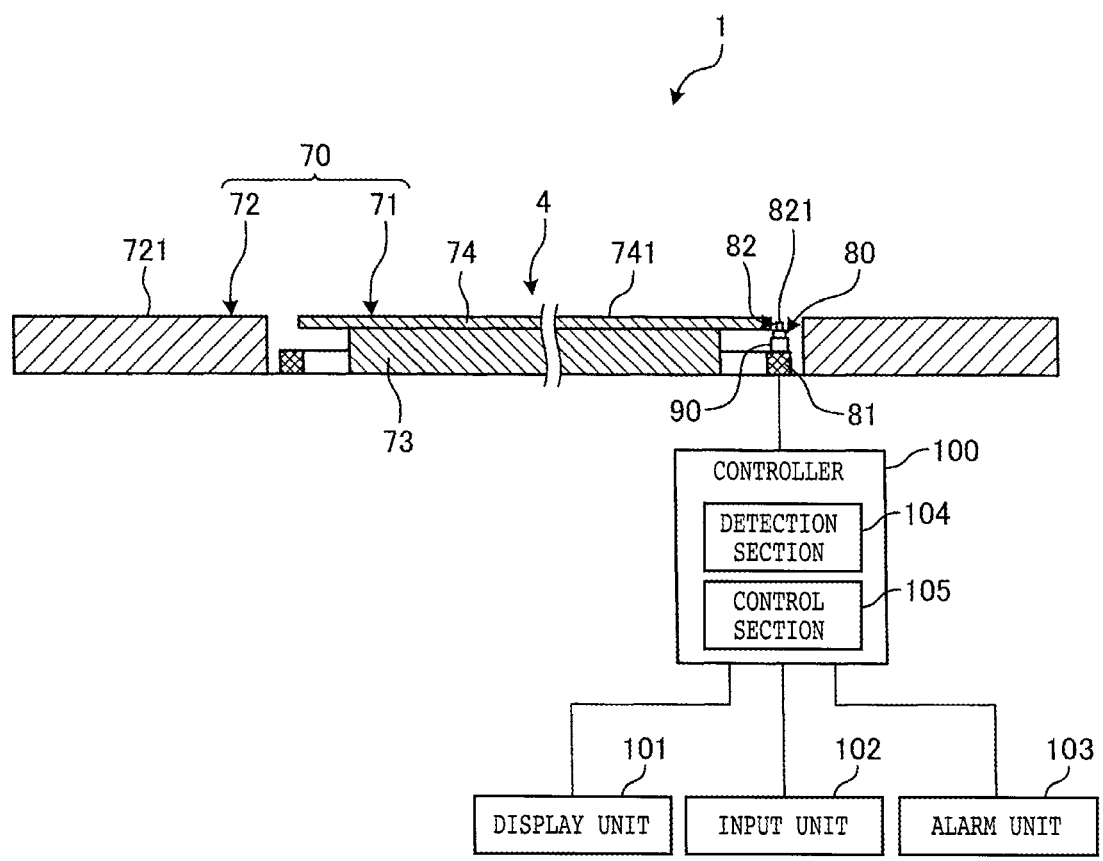
FIG. 2 is a sectional view depicting a configuration example of a cutting unit of the protective film forming apparatus according to the embodiment.
Figure 3:
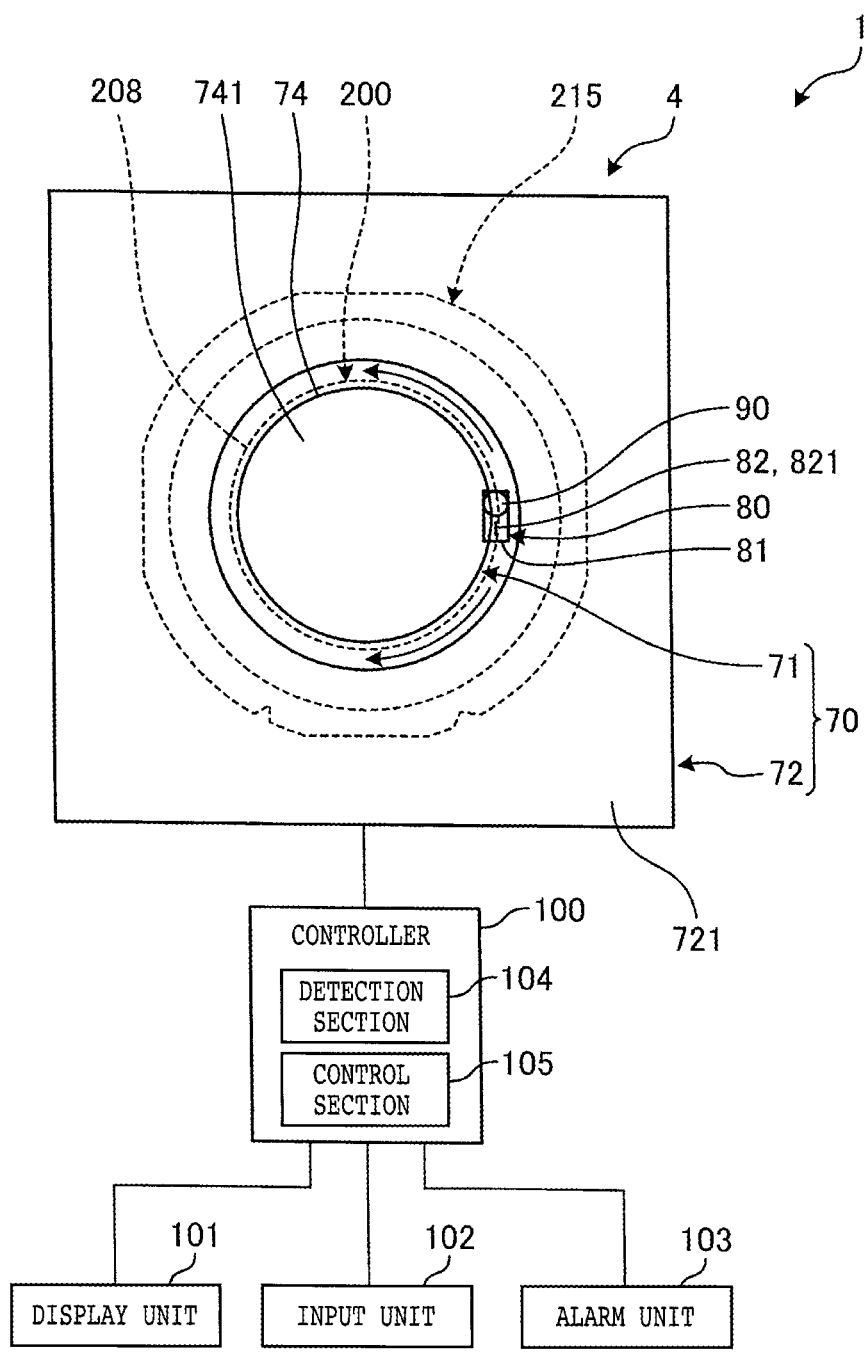
FIG. 3 is a plan view depicting a configuration example of the cutting unit of the protective member forming apparatus depicted in FIG. 2.
Figure 4:
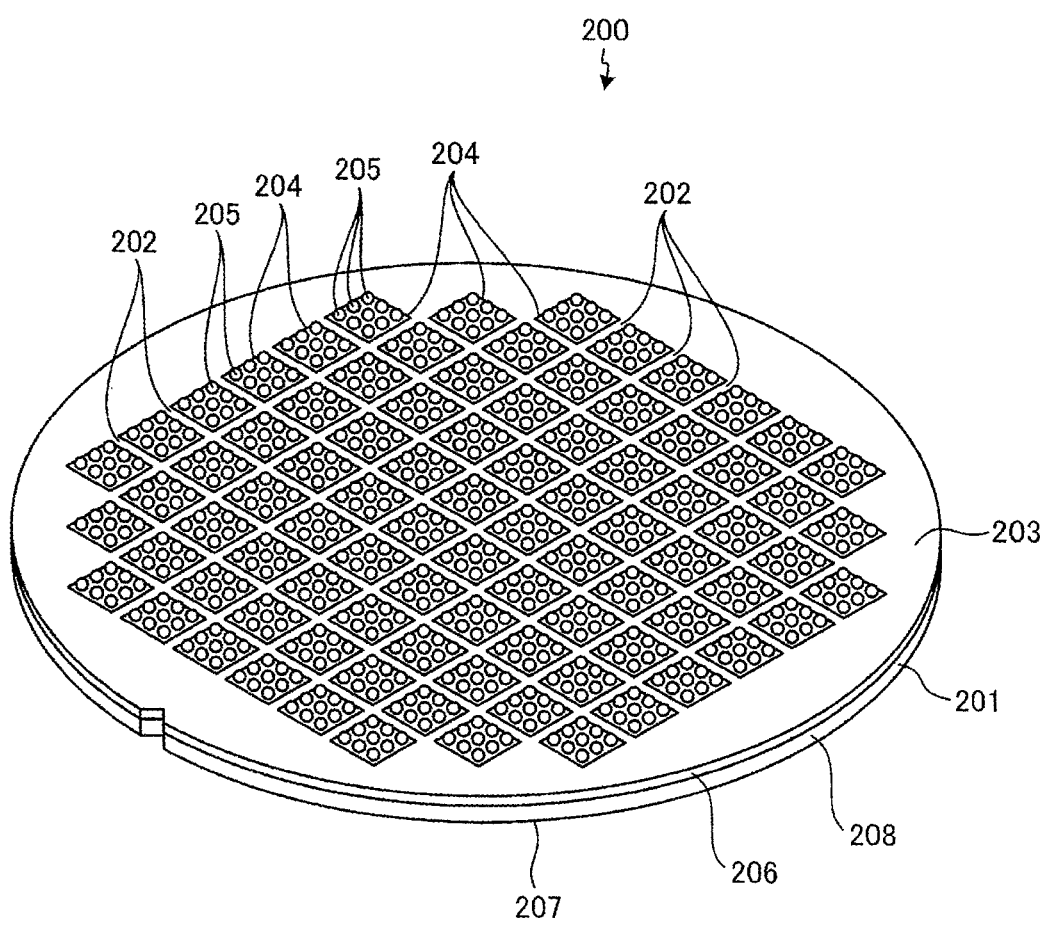
FIG. 4 is a perspective view depicting a wafer formed with a protective member by the protective member forming apparatus depicted in FIG. 1.
Figure 5:
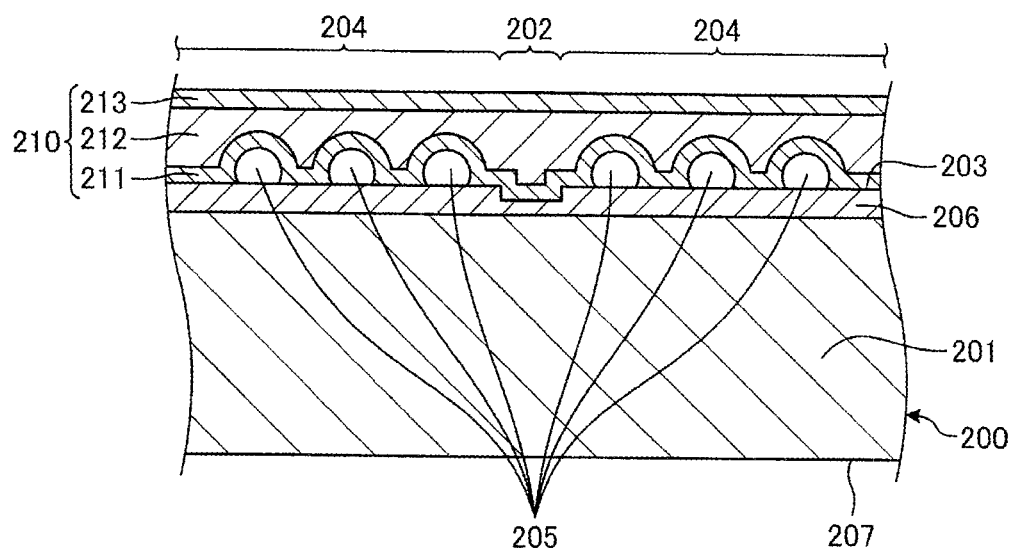
FIG. 5 is an enlarged sectional view of a major pat of the wafer depicted in FIG. 4.
Figure 6:
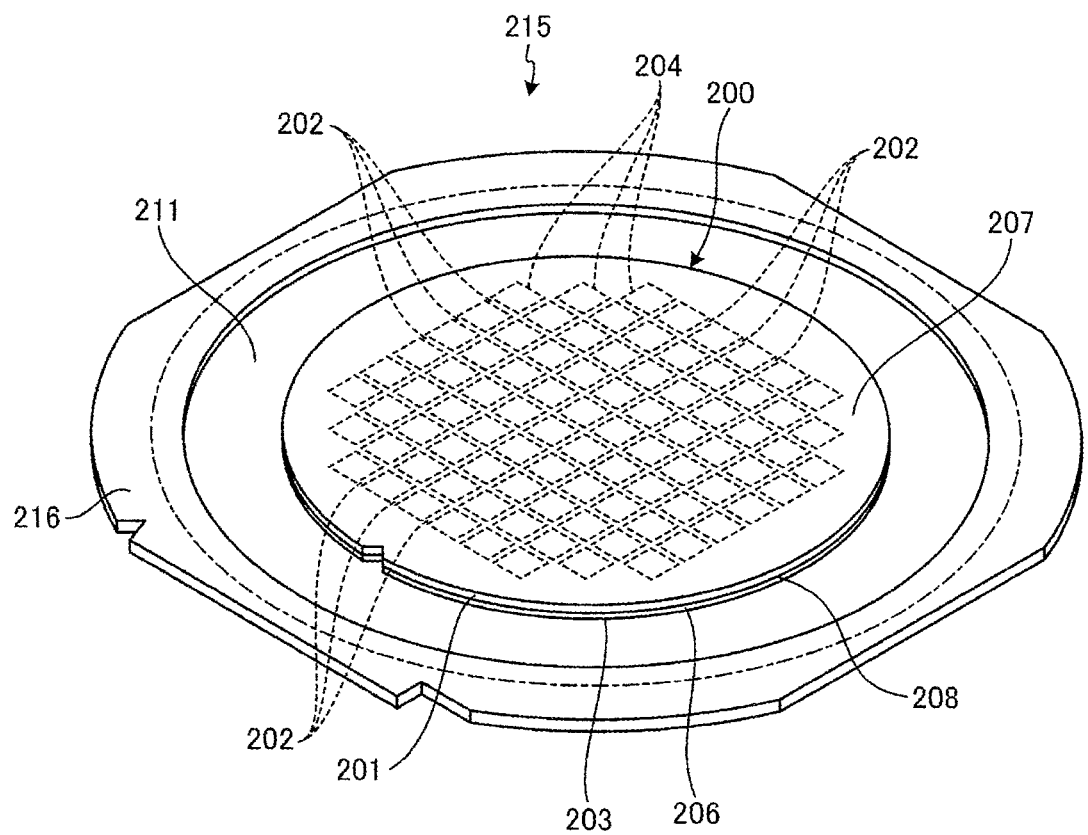
FIG. 6 is a perspective view depicting a frame unit that the wafer depicted in FIG. 4 constitutes.
Figure 7:
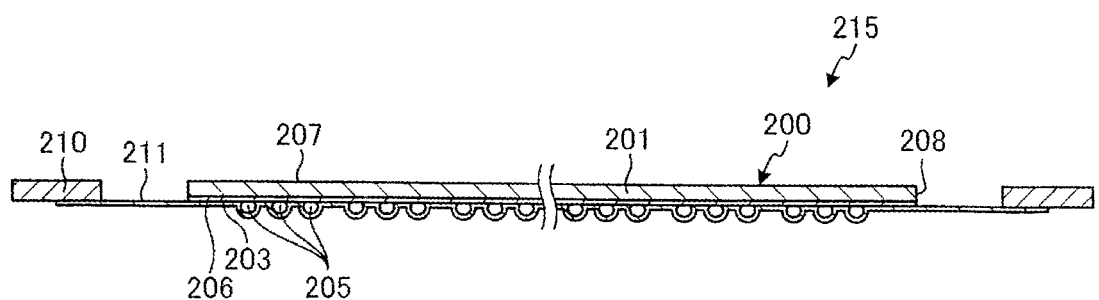
FIG. 7 is a sectional view of the frame unit depicted in FIG. 6.

A protective member forming apparatus according to an embodiment of the present invention will be described based on the drawings. FIG. 1 is a side view schematically depicting, partly in section, a configuration example of an integrating unit and a conveying unit of the protective member forming apparatus according to the embodiment of the present invention. FIG. 2 is a sectional view depicting a configuration example of a cutting unit of the protective member forming apparatus according to the embodiment. FIG. 3 is a plan view depicting a configuration example of the cutting unit of the protective member forming apparatus depicted in FIG. 2. FIG. 4 is a perspective view depicting a wafer to be formed with a protective member by the protective member forming apparatus illustrated in FIG. 1. FIG. 5 is a sectional view of a major part of the wafer depicted in FIG. 4. FIG. 6 is a perspective view depicting a frame unit that the wafer illustrated in FIG. 4 constitutes. FIG. 7 is a sectional view of the frame unit depicted in FIG. 6.

A protective member forming apparatus 1 illustrated in FIGS. 1, 2, and 3 according to the embodiment is an apparatus for forming a protective member 210 depicted in FIG. 5 having a desired thickness on a front surface 203 which is one surface of a wafer 200 depicted in FIG. 4. The wafer 200 to be formed with the protective member 210 by the protective member forming apparatus 1 according to the embodiment is a disk-shaped semiconductor wafer, optical device wafer, or the like including a substrate 201 of silicon (Si), sapphire ($Al_2O_3$), gallium arsenide (GaAs), silicon carbide (SiC) or the like.

As depicted in FIG. 4, the wafer 200 has devices 204 formed in respective regions of the front surface 203 partitioned by a plurality of intersecting streets 202. As illustrated in FIG. 5, each device 204 has a bump 205 projecting as compared to the front surface 203 and being connected to electrodes of each device 204. The device 204 is, for example, an integrated circuit such as an integrated circuit (IC) or large scale integration (LSI), an image sensor such as a charge-coupled device (CCD) or a complementary metal oxide semiconductor (CMOS), or micro electro mechanical systems (MEMS). The bumps 205 each include a conductive metal and, in the embodiment, are formed in spherical shape.

The bumps 205 are for electrically connecting the devices 204 and the electrodes of the substrate or the like on which the devices 204 are mounted. In the embodiment, the wafer 200 has the bumps 205 projecting as compared to the front surface 203, whereby the front surface 203 is formed with ruggedness (projections and recesses). In addition, in the embodiment, the wafer 200 has the bumps 205, and the front surface 203 is formed with ruggedness. However, the bumps 205 may not be provided in the present invention. Besides, in the present invention, the wafer 200 is not limited to a wafer, but may be a rectangular resin package substrate having a plurality of devices sealed in a resin, a ceramic plate, a glass sheet, or the like.

In the embodiment, the wafer 200 has a functional layer 206 laminated on a surface of the substrate 201. The functional layer 206 includes a low dielectric constant insulator film (hereinafter referred to as Low-k film) including an inorganic film such as SiOF or BSG (SiOB) or an organic film which is a polymer film based on polyimide, parylene, or the like and a conductor film including a conductive metal. The Low-k film is laminated with the conductor film to form a device 204. The conductor film constitutes circuits of the devices 204. Therefore, the device 204 includes the Low-k films laminated on one another and the conductor film laminated between the Low-k films. Note that the functional layer 206 of the streets 202 includes the Low-k film and does not include any conductor film exclusive of a test element group (TEG). The TEG is an element for evaluation for finding out problems on a design basis or a manufacture basis generated in the devices 204.

In the embodiment, the wafer 200 is formed with the protective member 210 on the front surface 203 side, the side of a back surface 207 which is the other surface on the back side of the front surface 203 is ground in a state in which the front surface 203 side is held on a chuck table of a grinding apparatus through the protective member 210, and the wafer 200 is thinned to a predetermined finish thickness. After being thinned, the wafer 200 is divided along the streets 202 into individual devices 204.

In the embodiment, as depicted in FIG. 5, the protective member 210 includes a resin film 211, a resin layer 212, and a resin sheet 213 (corresponding to a sheet) and is formed of two or more layers of resin. In the embodiment, the resin film 211 includes a thin flexible synthetic resin (in the embodiment, polyolefin (PO)) and is formed in a sheet shape. The resin film 211 is in close contact with the front surface 203 of the wafer 200 and surfaces of the bumps 205 and is attached thereto.

In the embodiment, the resin layer 212 includes a liquid resin 214 (depicted in FIG. 1) which cures by being given an external stimulus, and is laminated on the resin film 211. The liquid resin 214 constituting the resin layer 212 is a UV-curing liquid resin which cures when irradiated with UV rays as an external stimulus, but, in the present invention, this is not limitative, and, for example, a liquid resin which cures when heated may be used. The liquid resin 214 includes, for example, ResiFlat made by DISCO Corporation, or TEMPLOC made by Denka Company Limited.

The resin sheet 213 includes a thin flexible synthetic resin (in the embodiment, polyolefin (PO)) which transmits UV rays, and is formed in a film shape. The resin sheet 213 is laminated on the resin layer 212. The resin layer 212 includes the liquid resin 214 laminated between the resin film 211 and the resin sheet 213 and cured by being given an external stimulus. The total thickness of the protective member 210 and the wafer 200 is a thickness uniform over the whole area of the front surface 203. Note that, in the embodiment, the protective member 210 has a light-transmitting property, so that the front surface 203 of the wafer 200 can be visually observed through the protective member 210.

In addition, in the embodiment, the wafer 200 is formed with the protective member 210 by the protective member forming apparatus 1, in a state of constituting a frame unit 215 depicted in FIGS. 6 and 7. Note that the frame unit 215 is configured in a state in which the disk-shaped resin film 211 larger in diameter than the wafer 200 is in close contact, without leaving gaps, with the front surface 203 and the surfaces of the bumps 205, and an annular frame 216 is attached to a peripheral edge of the resin film 211.

The protective member forming apparatus 1 according to the embodiment is an apparatus that forms the protective member 210 on the front surface 203 of the wafer 200 of the frame unit 215 and cuts and removes a peripheral edge of the wafer 200 and the protective member 210 protruding from a peripheral edge 208 as the periphery. The protective member forming apparatus 1 includes an integrating unit 2 depicted in FIG. 1, a conveying unit 3 depicted in FIG. 1, and a cutting unit 4 depicted in FIGS. 2 and 3.

The integrating unit 2 supplies the liquid resin 214 to the resin sheet 213 held by a chuck table 10, spreads the resin 214 on the front surface 203 of the wafer 200, and cures the resin 214 by an external stimulus, thereby to integrate the resin sheet 213 with the wafer 200 by the resin 214. The integrating unit 2 includes the chuck table 10, a resin supply unit 20, a pressing unit 30, a light-shielding cover 40, and an ionizer unit 50.

The chuck table 10 has a plan-view shape formed in a rectangular shape larger than the plan-view shape of the frame unit 215, or the wafer 200, and includes a frame body 11, a holding plate 12, and a UV light source 13 as depicted in FIG. 1. The frame body 11 includes a bottom plate section 111 having a plan-view shape formed in a rectangular shape larger than the plan-view shape of the frame unit 215 and also includes a frame-like section 112 erected from a peripheral edge of the bottom plate section 111. The frame body 11 includes, for example, a metal such as stainless steel.

The holding plate 12 has a plan-view shape formed in a rectangular shape larger than the plan-view shape of the frame unit 215 and is attached to the inside of the frame-like section 112 of the frame body 11. The holding plate 12 is formed in the shape of a flat plate having a uniform thickness. An upper surface of the holding plate 12 is a holding surface 121 formed to be flat along the horizontal directions. The holding plate 12 includes a material having a light-transmitting property such as glass and transmits UV rays. The holding plate 12 has the resin sheet 213 mounted on the holding surface 121, the resin sheet 213 having a plan-view shape formed in a rectangular shape larger than the plan-view shape of the frame unit 215, or the wafer 200. The holding plate 12 holds the resin sheet 213 on the holding surface 121.

The UV light source 13 is disposed on the bottom plate section 111 of the frame body 11 and on a lower side of the holding plate 12 and is disposed inside the chuck table 10. The UV light source 13 is a UV ray irradiation lamp that irradiates UV rays. In this way, the chuck table 10 holds the resin sheet 213 by the holding surface 121 of the holding plate 12 which transmits UV rays from the UV light source 13 disposed inside the chuck table 10.

The resin supply unit 20 supplied the liquid resin 214 from a liquid resin supply source (not illustrated) onto a surface of the resin sheet 213 disposed on the holding surface 121. The resin supply unit 20 includes a supply pipe 21 supplied with the liquid resin 214 from the liquid resin supply source and a nozzle 22 being mounted to a tip of the supply pipe 21 and having a jetting port for jetting the liquid resin onto the resin sheet 213. The resin supply unit 20 is provided such that the nozzle 22 is movable by a moving mechanism (not illustrated) between a resin supply position facing the center of the holding surface 121 of the chuck table 10 in the vertical direction and a retracted position of being retracted from a position on an upper side of the holding surface 121 of the chuck table 10. The resin supply unit 20 has the nozzle 22 positioned at the resin supply position and supplies the liquid resin 214 onto the resin sheet 213 supported on the holding surface 121 of the chuck table 10.

The pressing unit 30 is for pressing the wafer 200, from the side of the back surface 207 on the back side of the front surface 203, toward the liquid resin 214 supplied onto a surface of the resin sheet 213 disposed on the holding surface 121. The pressing unit 30 includes a holding member 31, a lifting and lowering member 32 attached to the holding member 31, and a feeding unit 33.

The holding member 31 has a lower surface 311 formed flat along the horizontal directions, and the plan-view shape of the lower surface 311 is formed in a rectangular shape equal in size to the plan-view shape of the chuck table 10. The holding member 31 is disposed on an upper side of the chuck table 10, with the lower surface 311 facing the holding surface 121 in the vertical direction. The holding member 31 has the lower surface 311 formed with a plurality of suction holes which are connected to a suction source (not illustrated), and with the suction holes sucked by the suction source, the holding member 31 suction holds the wafer 200 on the lower surface 311. In the embodiment, the holding member 31 suction holds the annular frame 216 of the frame unit 215 and the back surface 207 of the wafer 200 onto the lower surface 311.

The lifting and lowering member 32 is fixed to an upper surface of the holding member 31 or the like. The feeding unit 33 includes a known ball screw 34 that is disposed in parallel to the vertical direction, is provided to be rotatable around an axis, and is in screw engagement with a screw hole of the lifting and lowering member 32; a motor 35 which is attached to an apparatus main body (not illustrated) and rotates the ball screw 34 around the axis to lift and lower the holding member 31 along the vertical direction; and known guide rails (not illustrated) which is attached to the apparatus main body and holds the lifting and lowering member 32 movably in the vertical Z-axis direction.

The pressing unit 30, with the wafer 200 suction held on the lower surface 311 of the holding member 31 and with the feeding unit 33 rotating the ball screw 34 around the axis, presses the wafer 200 held by the holding member 31 toward the liquid resin 214 supplied onto the resin sheet 213 held by the chuck table 10.

In the embodiment, the light-shielding cover 40 is a light-shielding member which is formed in a tubular shape with the chuck table 10 positioned on the inside thereof and covers a space 43 on an upper side of the holding surface 121. The light-shielding cover 40 includes a material which is light-shielding (particularly, restricting transmission of UV rays). Note that the space 43 is also a space inside the light-shielding cover 40.

In the embodiment, as illustrated in FIG. 1, the light-shielding cover 40 covers between the holding surface 121 of the chuck table 10 and the lower surface 311 of the holding member 31 of the pressing unit 30 spaced from the chuck table 10. In addition, the light-shielding cover 40 is provided with an opening 41 which provides communication between the outside and the inside of the light-shielding cover 40.

In addition, the light-shielding cover 40 includes a light-shielding shutter 42 capable of opening and closing the opening 41. The light-shielding shutter 42 is formed in the shape of a flat plate whose thickness is equal to the thickness of the light-shielding cover 40, and includes a material which is light-shielding (particularly, restricting transmission of UV rays). The light-shielding shutter 42 is provided to be movable between a closed position depicted in FIG. 9 or the like for closing the opening 41 and an open position for opening the opening 41 depicted in FIG. 1 or the like, by a moving mechanism (not illustrated). The light-shielding shutter 42 is moved between the closed position and the open position by the moving mechanism, thereby to close and open the opening 41 of the light-shielding cover 40.

In the embodiment, the light-shielding shutter 42 is disposed in parallel to a wall 401 which is spaced most from the opening 41 of the light-shielding cover 40. The light-shielding shutter 42 is slid in the vertical direction by the moving mechanism, thereby to be moved between the closed position and the open position. When positioned in the open position, the light-shielding shutter 42 permits the conveying unit 3 to enter into the space 43 on the holding surface 121 side inside the light-shielding cover 40.

The ionizer unit 50 jets ionized air 51 to the holding surface 121 of the chuck table 10, to neutralize the static charge of the holding surface 121 of the chuck table 10, thereby removing static electricity of the holding surface 121. In the embodiment, the ionizer unit 50 includes an ionizer for jetting the ionized air 51 and is of what is called a bar type in which the ionized air 51 is jetted over the whole length in the width direction of an end portion 217 (depicted in FIG. 8 or the like) near the light-shielding shutter 42 of the resin sheet 213 on the holding surface 121.

In the embodiment, the ionizer unit 50 extends rectilinearly in parallel to the light-shielding shutter 42 positioned in the open position and includes a jet port for jetting the ionized air 51. In addition, the ionizer unit 50 is disposed at a height equal in the vertical direction to the light-shielding shutter 42 positioned in the open position and jets the ionized air 51 toward the end portion 217 of the resin sheet 213 on the holding surface 121. The jetting direction of the ionized air 51 of the ionizer unit 50 is inclined obliquely relative to the vertical direction toward the center of the space 43 in side view. Therefore, a portion of the ionized air 51 jetted from the ionizer unit 50 is jetted in the direction for pressing, on the holding surface 121 side, the end portion 217 of the resin sheet 213 on the holding surface 121.

The conveying unit 3, holding the resin sheet 213, enters from the outside of the light-shielding cover 40 into the space 43 on the holding surface 121 side of the light-shielding cover 40 through the opening 41 and disposes the resin sheet 213 it holds onto the holding surface 121. In addition, the conveying unit 3 conveys the wafer 200, which is integrated with the resin sheet 213 and the like through the resin layer 212 formed by curing of the resin 214 by UV rays, from a position on the chuck table 10 to the cutting unit 4 through the opening 41. In the embodiment, the conveying unit 3 holds the resin sheet 213 to which the wafer 200 is fixed, when conveying the wafer 200 integrated with the resin sheet 213 and the like.

In the embodiment, the conveying unit 3 includes a suction pad 61, a holding member 62 that holds the suction pad 61, and a moving unit (not illustrated) that moves the holding member 62 in the vertical direction and the horizontal directions. The suction pad 61 is a non-contact type Bernoulli pad that is disposed at a corner or the like of the holding member 62, jets a pressurized gas, and holds the resin sheet 213 without making contact with the resin sheet 213 by a negative pressure of the gas. In addition, in the embodiment, the conveying unit 3 also includes a frame holding section (not illustrated) that suction holds the annular frame 216 of the frame unit 215 fixed to the resin sheet 213.

The cutting unit 4 holds, by a cutting table 70, the wafer 200 integrated with the resin sheet 213 and the like conveyed in by the conveying unit 3 and cuts the resin sheet 213 and the like along the peripheral edge 208 of the wafer 200 by a cutting section 80. As illustrated in FIGS. 2 and 3, the cutting unit 4 includes the cutting table 70, the cutting section 80, a camera 90, a moving unit (not illustrated), and a controller 100.

The cutting table 70 includes a main body section 71 smaller in diameter than the wafer 200 and a sheet holding section 72 which is disposed with a spacing from a peripheral edge of the main body section 71 and which holds the resin sheet 213. The main body section 71 includes a cylindrical section 73 in a cylindrical shape and a disk-shaped table section 74 being attached to an upper end of the cylindrical section 73, being smaller in diameter than the wafer 200, and being larger in diameter than the cylindrical section 73. An upper surface of the table section 74 is a holding surface 741 which is formed to be flat along the horizontal directions and holds the resin sheet 213 integrated with the wafer 200 of the frame unit 215. The main body section 71 and the table section 74 are disposed at such positions as to be coaxial with each other.

The sheet holding section 72 is formed with a round hole having an inside diameter larger than the outside diameter of the table section 74 of the main body section 71 and the outside diameter of the wafer 200, and its thickness is equal to the total thickness of the cylindrical section 73 and the table section 74 of the main body section 71. The sheet holding section 72 has the main body section 71 disposed inside the round hole and is disposed at such a position as to be coaxial with the main body section 71. An upper surface of the sheet holding section 72 is a holding surface 721 which is formed flat along the horizontal directions and holds the resin sheet 213 integrated with the wafer 200 of the frame unit 215.

The resin sheet 213 of the protective member 210 formed in the frame unit 215 is mounted on the holding surfaces 741 and 721 of the cutting table 70 by the conveying unit 3, and the frame unit 215 formed with the protective member 210 is conveyed in to the cutting table 70. The cutting unit 4 holds the frame unit 215 formed with the protective member 210 and conveyed in through the resin sheet 213. In addition, in the cutting table 70, when the frame unit 215 is mounted on an authorized position of the holding surfaces 741 and 721 by the conveying unit 3, the frame unit 215 becomes coaxial with the main body section 71 and the sheet holding section 72. In the embodiment, the accuracy of the position at which the frame unit 215 is mounted on the holding surfaces 741 and 721 by the conveying unit 3 is equal to or less than 100 μm, desirably equal to or less than several tens of micrometers, from the authorized position.

The cutting section 80 includes a cutting main body section 81 supported by the moving unit and a cutter blade 82 supported by the cutting main body section 81. The cutting main body section 81 is disposed between the main body section 71 and the sheet holding section 72 of the cutting table 70. The cutter blade 82 cuts into the resin sheet 213 from the cutting table 70 side, between the cutting table 70 and the sheet holding section 72. The cutter blade 82 has a base end portion supported by the cutting main body section 81 and erected upward from the cutting main body section 81. The cutter blade 82 is provided at an upper end with a cutting edge 821 that cuts into the protective member 210 formed in the frame unit 215.

The camera 90 is attached to the cutting main body section 81 of the cutting section 80 and images the peripheral edge 208 of the wafer 200 of the frame unit 215 mounted on the holding surfaces 741 and 721 and the vicinity of the peripheral edge 208. The camera 90 includes an imaging element (namely, pixels) for imaging the peripheral edge 208 of the wafer 200 of the frame unit 215 mounted on the holding surfaces 741 and 721 and the vicinity of the peripheral edge 208. The imaging element is, for example, a CCD imaging element or a CMOS imaging element.

Figure 12:
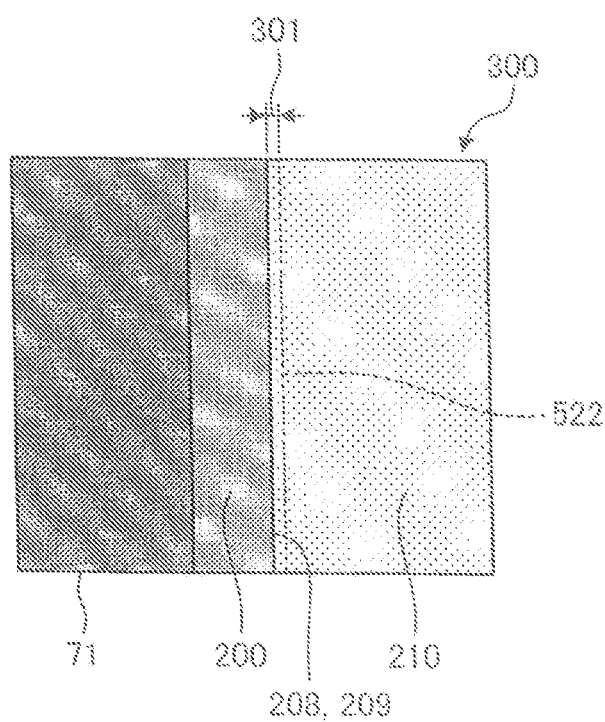
FIG. 12 is a diagram schematically depicting an image imaged and acquired by a camera of the cutting unit of the protective member forming apparatus depicted in FIG. 2.

The camera 90 images the peripheral edge 208 of the wafer 200 of the frame unit 215 mounted on the holding surfaces 741 and 721 and the vicinity of the peripheral edge 208, to acquire an image 300 exemplified in FIG. 12, and outputs the acquired image 300 to the controller 100. Note that the image 300 acquired by the camera 90 is one in which the intensity of light imaged by each imaging element is defined in a plurality of levels (for example, 256 levels) of gradations. In other words, the image 300 imaged and acquired by the camera 90 is an image in which the intensity of light is represented by the levels of the intensity of light received by the pixels, or an image with light and shade.

The moving unit supports the cutting main body section 81 of the cutting section 80, or the cutter blade 82, and the camera 90 between the main body section 71 and the sheet holding section 72 of the cutting table 70 in a manner of being movable in the circumferential direction of the cutting table 70 and the sheet holding section 72. In addition, the moving unit supports the cutting main body section 81 of the cutting section 80, or the cutter blade 82, and the camera 90 between the main body section 71 and the sheet holding section 72 of the cutting table 70 in a manner of being movable in the thickness direction of the cutting table 70 and the sheet holding section 72.

The cutting unit 4 holds the resin sheet 213 of the protective member 210 formed in the frame unit 215 on the holding surfaces 741 and 721 of the cutting table 70 and the sheet holding section 72. The cutting unit 4, with the moving unit raising the cutting main body section 81, causes the cutting edge 821 to cut, from the cutting table 70 side, into the protective member 210 protruding from the peripheral edge 208 of the wafer 200 in the outer circumferential direction, and causes the cutting main body section 81 to move at least one circumference in the circumferential direction of the cutting table 70 and the sheet holding section 72, thereby to cut the resin sheet 213, the resin layer 212, and the resin film 211, namely, the protective member 210, along the peripheral edge 208 of the wafer 200 by the cutter blade 82 of the cutting section 80.

Note that the rotational center of the cutting main body section 81 of the cutting unit 4 coincides with the center of the main body section 71, and, when the frame unit 215 is mounted on the authorized position of the holding surfaces 741 and 721, the center of the moving locus of the cutter blade 82 rotating in the circumferential direction coincides with the center of the wafer 200. However, when the frame unit 215 is mounted at a position deviated from the authorized position of the holding surfaces 741 and 721 in the cutting unit 4, the wafer 200 becomes eccentric relative to the moving locus of the cutter blade 82, so that the moving locus of the cutter blade 82 overlaps with the wafer 200, and the wafer 200 may be damaged.

The controller 100 controls each of the configuration elements of the cutting unit 4 and the protective member forming apparatus 1 for causing the cutting unit 4 and the protective member forming apparatus 1 to perform a protective member forming operation of forming the protective member 210 on the front surface 203 side of the wafer 200 and cutting the protective member 210 protruding from the peripheral edge 208 of the wafer 200 in the outer circumferential direction. The controller 100 is a computer that has an arithmetic processing device having a microprocessor such as a central processing unit (CPU), a storage device having a memory such as a read only memory (ROM) or a random access memory (RAM), and an input-output interface device, and can execute a computer program.

The arithmetic processing device of the controller 100 executes a computer program stored in the ROM on the RAM, to generate control signals for controlling the cutting unit 4 and the protective member forming apparatus 1. The arithmetic processing device of the controller 100 outputs the generated control signals to configuration elements of the cutting unit 4 and the protective member forming apparatus 1 through the input-output interface device.

In addition, the controller 100 is connected to a display unit 101 including a liquid crystal display or the like for displaying a state of a processing operation, an image, and the like, an input unit 102 used by an operator when the operator registers processing contents information and the like, and an alarm unit 103. In other words, the cutting unit 4 and the protective member forming apparatus 1 include the display unit 101, the input unit 102, and the alarm unit 103. The input unit 102 includes at least one of a tough panel provided on the display unit, a keyboard, and the like. The alarm unit 103 is for giving an alarm to the operator by generating at least one of a sound and light.

In addition, the controller 100 includes a detection section 104 as a detection unit and a control section 105 as a control unit. The detection section 104 is for detecting the position of the peripheral edge 208 of the wafer 200 from the image 300 acquired by imaging the wafer 200 by the camera 90. The detection section 104 extracts the peripheral edge 208 of the wafer 200 from the image 300 and detects the position of the peripheral edge 208 from the positions of the pixels of the peripheral edge 208.

The control section 105 causes cutting of the resin sheet 213 by the cutting section 80 to be performed only in a case where the peripheral edge 208 of the wafer 200 detected coincides with a track 522 (indicated by a broken line in FIG. 12) of the cutting edge 821 of the cutter blade 82 of the cutting section 80 when the cutter blade 82 cuts the preset resin sheet 213. The control section 105 stores an authorized position 209 (depicted in FIG. 12) of the peripheral edge 208 of the wafer 200, of the image 300 imaged and acquired by the camera 90 preliminarily. The authorized position 209 of the peripheral edge 208 of the wafer 200, of the image 300, is the position of the peripheral edge 208 of the wafer 200 of the frame unit 215 mounted on the authorized position (namely, a position without deviation) of the holding surfaces 741 and 721.

In addition, the control section 105 stores the position of the track 522 of the cutting edge 821 of the cutter blade 82, of the image 300 imaged and acquired by the camera 90 preliminarily. The position of the track 522 of the cutting edge 821 of the cutter blade 82, of the image 300, is the position of the locus where the cutting edge 821 of the cutter blade 82 passes when the cutter blade 82 is moved in the circumferential direction by the moving unit. In the embodiment, the position of the track 522 of the cutting edge 821 of the cutter blade 82, of the image 300, is located on the outer circumferential side of the wafer 200 as compared to the authorized position 209 of the peripheral edge 208 of the wafer 200, of the image 300.

The control section 105 determines, in each of the images 300 acquired by the camera, whether or not the position of the peripheral edge 208 of the wafer 200 detected by the detection section 104 is located at the prestored authorized position 209 of the peripheral edge 208 of the wafer 200, at the position of the track 522 of the cutting edge 821 off the cutter blade 82, or at a position between these positions. When it is determined that the position of the peripheral edge 208 of the wafer 200 detected by the detection section 104 is located at the prestored authorized position 209 of the peripheral edge 208 of the wafer 200, at the position of the track 522 of the cutting edge 821 of the cutter blade 82, or at a position between these position, in all of the images 300 acquired by the camera, the control section 105 determines that the peripheral edge 208 of the wafer 200 detected coincides with the track 522 of the cutting edge 821 of the cutter blade 82 of the cutting section 80 when the cutter blade 82 cuts the preset resin sheet 213, and causes cutting of the resin sheet 213 by the cutting section 80 to be performed.

In addition, when it is determined, in at least one of the images 300 acquired by the camera, that the position of the peripheral edge 208 of the wafer 200 detected by the detection section 104 is not located at the prestored authorized position 209 of the peripheral edge 208 of the wafer 200, at the position of the track 522 of the cutting edge 821 of the cutter blade 82, or at a position between these positions, the control section 105 determines that the peripheral edge 208 of the wafer 200 detected does not coincide with the track 522 of the cutting edge 821 of the cutter blade 82 of the cutting section 80 when the cutter blade 82 cuts the present resin sheet 213, and inhibits cutting (restricts cutting) of the resin sheet 213 by the cutting section 80. Note that a range between the prestored authorized position 209 of the peripheral edge 208 of the wafer 200 and the position of the track 522 of the cutting edge 821 of the cutter blade 82 is an allowable range 301 of the position of the peripheral edge 208 of the wafer 200 of the frame unit 215 held by the holding surfaces 741 and 721 when cutting of the protective member 210, namely, the resin sheet 213, by the cutting edge 821 is performed. The allowable range 301 is equal to or less than 100 μm, desirably equal to or less than several tens of micrometers. In this way, the control section 105 determines whether or not the peripheral edge 208 of the wafer 200 is positioned within the allowable range 301, or a predetermined position, relative to the position of the track 522 of the cutter blade 82 of the cutting section 80.

Note that the function of the detection section 104 is realized by performing, by the arithmetic processing device, arithmetic processing according to the computer program stored in the storage device. In addition, the functions of the control section 105 are realized by preliminarily storing, by the storage device, the authorized position 209 of the peripheral edge 208 of the wafer 200 and the position of the track 522 of the cutting edge 821 of the cutter blade 82 and by performing, by the arithmetic processing device, arithmetic processing according to the computer program stored in the storage device.

Figure 8:
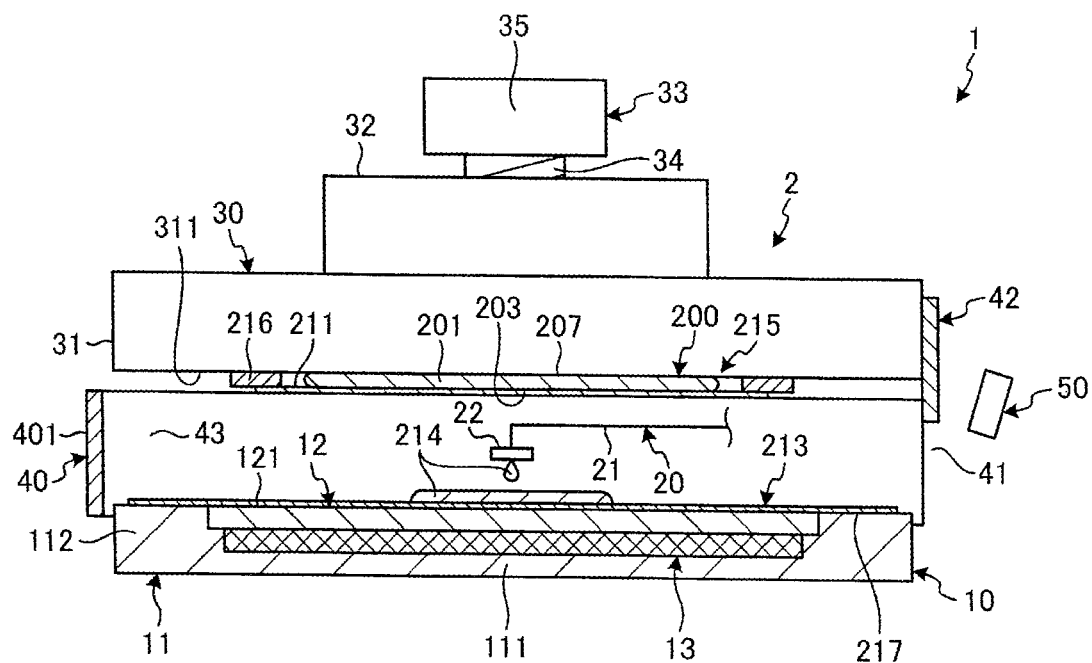
FIG. 8 is a side view schematically depicting, partly in section, a state in which the integrating unit of the protective member forming apparatus depicted in FIG. 1 supplies a liquid resin onto a surface of a resin sheet on a holding surface.
Figure 9:
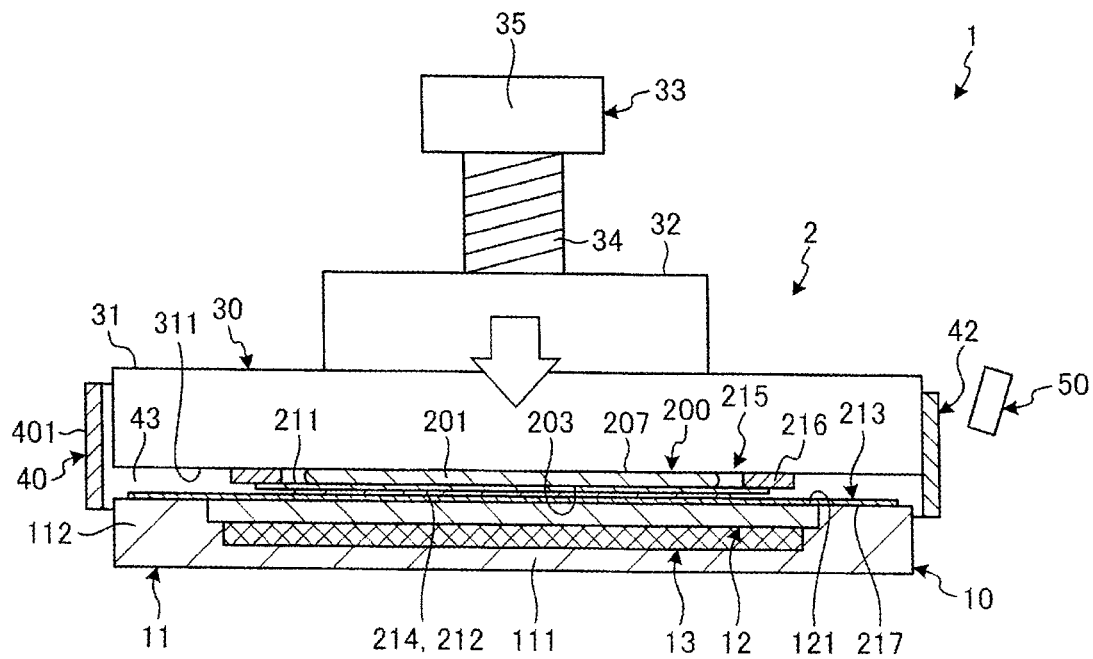
FIG. 9 is a side view schematically depicting, partly in section, a state in which a pressing unit of the integrating unit of the protective member forming apparatus depicted in FIG. 1 presses the wafer against the liquid resin.
Figure 10:
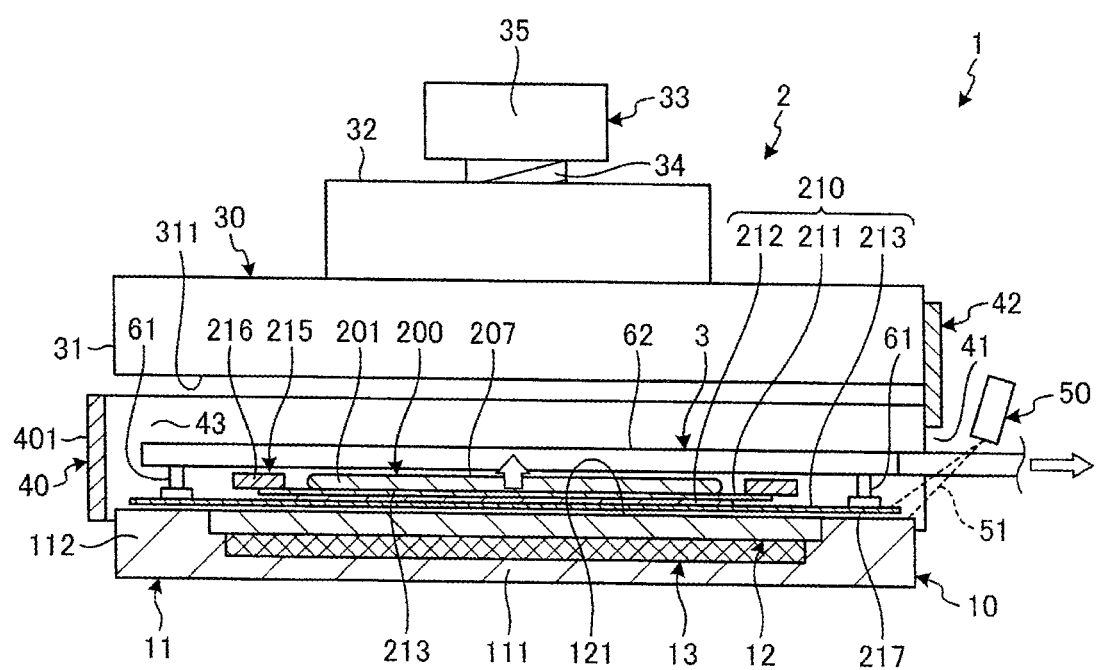
FIG. 10 is a side view schematically depicting, partly in section, a state in which the conveying unit of the protective member forming apparatus depicted in FIG. 1 holds the resin sheet on the holding surface and conveys out the wafer.
Figure 11:
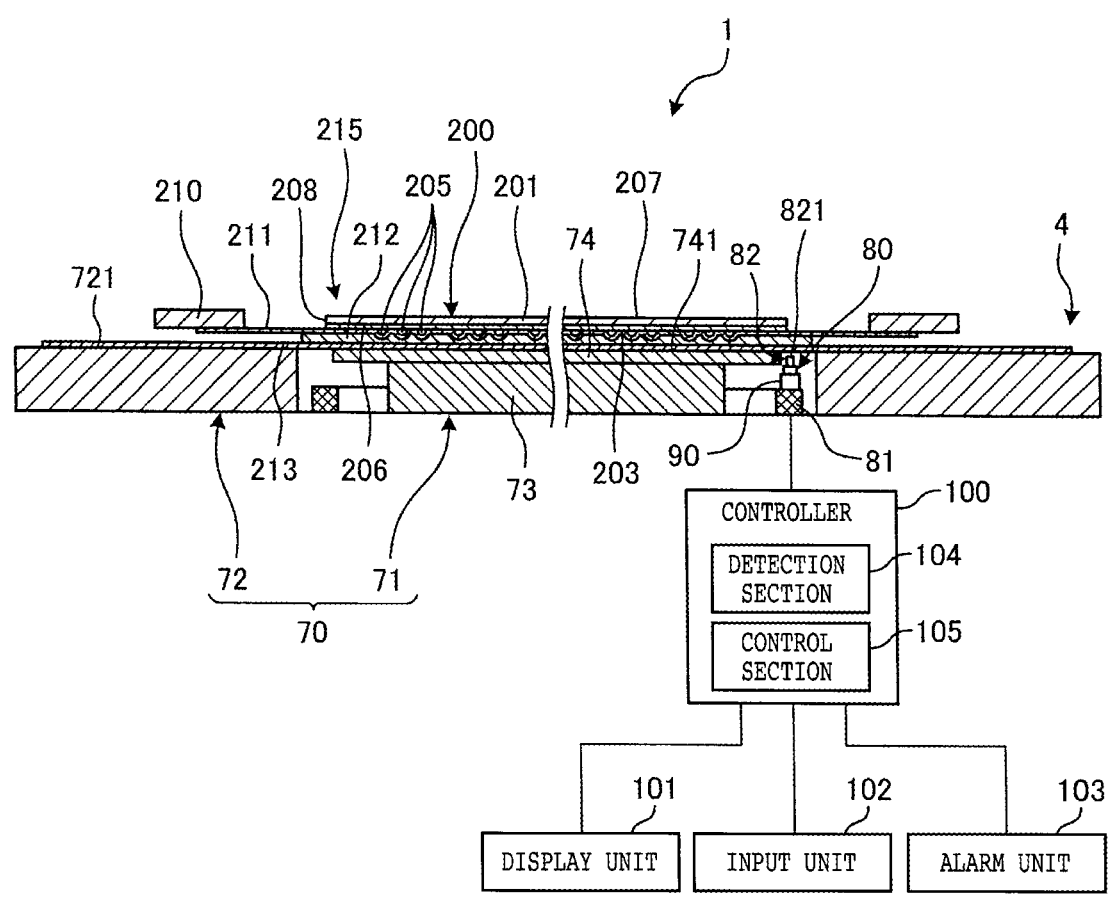
FIG. 11 is a sectional view depicting a state in which a cutting table of the cutting unit of the protective member forming apparatus depicted in FIG. 2 holds the frame unit.

Next, a protective member forming operation of the protective member forming apparatus 1 configured as described above will be described based on the drawings. FIG. 8 is a side view schematically depicting, partly in section, a state in which the liquid resin is supplied onto a surface of the resin sheet on the holding surface by the integrating unit of the protective member forming apparatus depicted in FIG. 1. FIG. 9 is a side view schematically depicting, partly in section, a state in which the pressing unit of the integrating unit of the protective member forming apparatus depicted in FIG. 1 presses the wafer against the liquid resin. FIG. 10 is a side view schematically depicting, partly in section, a state in which the conveying unit of the protective member forming apparatus depicted in FIG. 1 holds the resin sheet on the holding surface and conveys out the wafer. FIG. 11 is a sectional view depicting a state in which the cutting table of the cutting unit of the protective member forming apparatus depicted in FIG. 2 holds the frame unit. FIG. 12 is a diagram schematically depicting an image imaged and acquired by the camera of the cutting unit of the protective member forming apparatus depicted in FIG. 2.

The protective member forming apparatus 1 configured as described above has the controller 100 to control the configuration elements, thereby performing a protective member forming operation of forming the protective member 210. In the protective member forming operation, the integrating unit 2 of the protective member forming apparatus 1 first positions the pressing unit 30, which suction holds, on the lower surface 311 of the holding member 31, the annular frame 216 of the frame unit 215 and the back surface 207 side of the wafer 200, at a position spaced from the holding surface 121. The integrating unit 2 of the protective member forming apparatus 1 positions the light-shielding shutter 42 at the open position, opens the opening 41, and causes the conveying unit 3 to convey the resin sheet 213 held by the suction pad 61 into the space 43, whereby the resin sheet 213 is mounted on the holding surface 121 of the holding plate 12 of the chuck table 10, and the resin sheet 213 is held on the holding surface 121. The integrating unit 2 of the protective member forming apparatus 1 positions the nozzle 22 of the resin supply unit 20 at the resin supply position, and, as depicted in FIG. 8, supplies a predetermined quantity of the liquid resin 214 from the nozzle 22 onto the resin sheet 213.

In the protective member forming operation, the integrating unit 2 of the protective member forming apparatus 1 positions the nozzle 22 of the resin supply unit 20 at a retracted position, positions the light-shielding shutter 42 at a closed position, closes the opening 41, and lowers the holding member 31 of the pressing unit 30, thereby to lower the wafer 200 suction held by the holding member 31 to a position where the protective member 210 becomes a desired thickness. Then, the integrating unit 2 of the protective member forming apparatus 1 causes the front surface 203 side of the wafer 200 to make contact with the liquid resin 214 on the resin sheet 213 through the resin film 211, lowers the wafer 200, and spreads the liquid resin 214 by the front surface 203 side toward the periphery of the resin sheet 213. Then, when the wafer 200 is lowered to such a position that the protective member 210 becomes a desired thickness, as depicted in FIG. 9, the liquid resin 214 makes close contact with the resin sheet 213 and the resin film 211, thereby coating the whole part of the front surface 203 of the wafer 200 through the resin film 211.

In the protective member forming operation, the integrating unit 2 of the protective member forming apparatus 1 stops the holding member 31 at a position where the protective member 210 becomes a desired thickness and applies UV rays from the UV light source 13 through the holding plate 12 and the resin sheet 213 to the liquid resin 214, to give an external stimulus to the liquid resin 214. The integrating unit 2 of the protective member forming apparatus 1 cures the liquid resin 214 to form the resin layer 212, thereby forming the protective member 210 of a desired thickness on the front surface 203 of the wafer 200. In this way, the wafer 200 is fixed to the resin sheet 213 through the cured liquid resin 214, or the resin layer 212, and the resin film 211. The integrating unit 2 of the protective member forming apparatus 1 stops suction holding of the frame unit 215 by the holding member 31. Then, the chuck table 10 holds the wafer 200 by the holding surface 121 of the holding plate 12 which transmits the UV rays from the UV light source 13 disposed inside the chuck table 10.

In the protective member forming operation, the integrating unit 2 of the protective member forming apparatus 1 raises the holding member 31 of the pressing unit 30, positions the light-shielding shutter 42 at the open position, opens the opening 41, and, simultaneously, jets the ionized air 51 from the ionizer unit 50. Then, even if a gas which enters into the space 43 is generated when the light-shielding shutter 42 opens the opening 41, the ionized air 51 jetted from the ionizer unit 50 presses the end portion 217 of the resin sheet 213 on the holding surface 121 against the holding surface 121, to prevent the end portion 217 of the resin sheet 213 from being lifted up from the holding surface 121. In this way, a portion of the ionized air 51 jetted from the ionizer unit 50 is jetted in a direction for pressing the end portion 217 of the resin sheet 213 down to the holding surface 121 when the light-shielding shutter 42 is opened. In addition, since the ionized air 51 is jetted, even if the holding surface 121 of the holding plate 12 is statically charged, the static charge is neutralized, and the static electricity is removed.

In the protective member forming operation, the conveying unit 3 of the protective member forming apparatus 1 enters into the space 43 inside the light-shielding cover 40 through the opening 41 and holds the resin sheet 213 on the holding surface 121 by the suction pad 61. In the protective member forming operation, the conveying unit 3 of the protective member forming apparatus 1 holds the resin sheet 213 on the holding surface 121 by the suction pad 61 and rises within the space 43 inside the light-shielding cover 40, to raise the resin sheet 213 from the holding surface 121, as depicted in FIG. 10. Then, the ionized air 51 jetted from the ionizer unit 50 goes along the holding surface 121 to be supplied into a gap between the resin sheet 213 and the holding surface 121, whereby the static charge on the whole part of the holding surface 121 of the holding plate 12 is neutralized, and static electricity is removed. In this way, when the resin sheet 213 is spaced away from the holding surface 121 by the conveying unit 3, the ionized air 51 goes along the holding surface 121, to be supplied into the gap between the resin sheet 213 and the holding surface 121.

Thereafter, in the protective member forming operation, the conveying unit 3 of the protective member forming apparatus 1 conveys the conveying unit 3 to the outside of the light-shielding cover 40 through the opening 41 and conveys out the wafer 200 formed with the protective member 210 to the outside of the light-shielding cover 40. In the protective member forming operation, the conveying unit 3 of the protective member forming apparatus 1 mounts the wafer 200 integrated with the resin sheet 213, namely, the frame unit 215 formed with the protective member 210, on the holding surfaces 741 and 721 of the cutting table 70.

In the protective member forming operation, the cutting unit 4 of the protective member forming apparatus 1 holds the wafer 200 integrated with the resin sheet 213, namely, the frame unit 215 formed with the protective member 210, on the holding surfaces 741 and 721 of the cutting table 70, as illustrated in FIG. 11. In the protective member forming operation, the cutting unit 4 of the protective member forming apparatus 1 causes the camera 90 to image the peripheral edge 208 of the wafer 200 and the vicinity of the peripheral edge 208 at an interval of a predetermined time while the detection section 104 of the controller 100 moves the cutting main body section 81, or the camera 90, by the moving unit at least one circumference in the circumferential direction between the main body section 71 and the sheet holding section 72, thereby to acquire image 300 depicted in FIG. 12. Note that the image 300 of FIG. 12 is an example in which the peripheral edge 208 of the wafer 200 of the frame unit 215 held by the holding surfaces 741 and 721 is positioned at the authorized position 209.

In the protective member forming operation, the cutting unit 4 of the protective member forming apparatus 1 causes the detection section 104 of the controller 100 to detect the positions of the peripheral edges 208 of the wafer 200 in the images 300. The cutting unit 4 of the protective member forming apparatus 1 causes the control section 105 of the controller 100 to determine, in each of the images 300 acquired by the camera, whether or not the position of the peripheral edge 208 of the wafer 200 detected by the detection section 104 is located at the prestored authorized position 209 of the peripheral edge 208 of the wafer 200, at the position of the track 522 of the cutting edge 821 of the cutter blade 82, or at a position between these positions.

In the protective member forming operation, the cutting unit 4 of the protective member forming apparatus 1, when the control section 105 of the controller 100 determines, in all of the images 300 acquired by the camera, that the position of the peripheral edge 208 of the wafer 200 detected by the detection section 104 is located at the prestored authorized position 209 of the peripheral edge 208 of the wafer 200, at the position of the track 522 of the cutting edge 821 of the cutter blade 82, or at a position between these positions, the controller 100 causes the moving unit to raise the cutting main body section 81, thereby to cause the cutting edge 821 to cut, from the cutting table 70 side, into the protective member 210 protruding from the peripheral edge 208 of the wafer 200 in the outer circumferential direction. In the protective member forming operation, the cutting unit 4 of the protective member forming apparatus 1 causes the control section 105 of the controller 100 to move the cutting main body section 81 at least one circumference in the circumferential direction of the cutting table 70 and the sheet holding section 72 by the moving unit, thereby to cut the resin sheet 213, the resin layer 212, and the resin film 211, or the protective member 210, along the peripheral edge 208 of the wafer 200 by the cutter blade 82 of the cutting section 80, and to perform cutting of the resin sheet 213 by the cutting section 80, and finishes the protective member forming operation.

In addition, in the protective member forming operation, when the control section 105 of the controller 100 determines, in at least one of the images 300 acquired by the camera, that the position of the peripheral edge 208 of the wafer 200 detected by the detection section 104 is not located at the prestored authorized position 209 of the peripheral edge 208 of the wafer 200, at the position of the track 522 of the cutting edge 821 of the cutter blade 82, or at a position between these positions, the cutting unit 4 of the protective member forming apparatus 1 operates the alarm unit 103 to give an alarm to the operator and finishes the protective member forming operation, without performing cutting of the resin sheet 213 by the cutting section 80.

The protective member forming apparatus 1 according to the embodiment as described above detects the position of the peripheral edge 208 of the wafer 200 from the images 300 imaged and acquired by the camera 90 before cutting of the resin sheet 213, thereby to determine whether the peripheral edge 208 of the wafer 200 is positioned within the allowable range 301, or a predetermined position, relative to the position of the track 522 of the cutter blade 82 of the cutting section 80. Therefore, the protective member forming apparatus 1 does not half-damage the wafer 200 by the cutting section 80 by mistake. As a result, the protective member forming apparatus 1 produces an effect that the protective member 210 protruding from the peripheral edge 208 of the wafer 200 can be removed, while damaging of the wafer 200 is restrained.

In addition, the protective member forming apparatus 1 holds the resin sheet 213 side by the cutting table 70 and causes the cutter blade 82 to cut into from the cutting table 70 side, which produces an effect that the resin sheet 213, the resin layer 212, and the like do not be exfoliated from the wafer 200 by stress at the time of cutting.

In addition, in a case where the position of the peripheral edge 208 of the wafer 200 is not positioned within the allowable range 301, the protective member forming apparatus 1 may calculate the deviation amount and the deviation direction and may place the wafer 200 again by the conveying unit 3 at such a position that the deviation of the wafer 200 is compensated for. Besides, the protective member forming apparatus 1 may include an advancing-retracting mechanism with which the cutter blade 82 can be advanced and retracted in the radial direction relative to the rotational center, and the cutter blade 82 may be advanced or retracted during cutting, whereby cutting of the protective member 210 may be conducted by setting the position of the cutter blade 82 along the peripheral edge 208 of the wafer 200 detected, even if the position of the peripheral edge 208 of the wafer 200 is not the authorized position but is an eccentric position.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus for forming a protective member on one surface of a wafer, the protective member forming apparatus comprising:
    an integrating unit that supplies a liquid resin curable by an external stimulus to a sheet larger than the wafer held by a chuck table, spreads the resin on a surface of the wafer, and cures the resin by an external stimulus, to integrate the sheet with the wafer by the resin;
    a conveying unit that conveys the wafer integrated with the sheet; and
    a cutting unit that holds, by a cutting table, the wafer integrated with the sheet conveyed by the conveying unit and cuts the sheet by a cutting section along a periphery of the wafer,
    wherein the cutting unit includes
        a detection unit that images the wafer by a camera and detects a position of a peripheral edge of the wafer, and
        a control unit configured to cut the sheet on an outer circumferential side of the wafer using the cutting section only in a case where the peripheral edge of the wafer detected by the camera coincides with a track of the cutting section when the integrated sheet is cut, the control unit is configured to store a position of the track of the cutting section which is preliminarily imaged and acquired by the camera.

2. The protective member forming apparatus according to claim 1, wherein the cutting unit includes
    a main body section smaller in diameter than the wafer, and
    a sheet holding section that holds the integrated sheet with a spacing from a peripheral edge of the main body section, and
    the cutting section has a cutter blade that cuts into the integrated sheet from a side of the cutting table between the main body section and the sheet holding section.

3. The protective member forming apparatus according to claim 1, further comprising an ionizer unit that directs ionized air at a holding surface of the chuck table.

4. The protective member forming apparatus according to claim 3, wherein the chuck table includes a UV light source.

* * * * *